(12) United States Patent
Lin et al.

(10) Patent No.: US 9,905,457 B2
(45) Date of Patent: Feb. 27, 2018

(54) HIGH BOILING TEMPERATURE SOLVENT ADDITIVES FOR SEMICONDUCTOR PROCESSING

(71) Applicant: Taiwan Semiconductor Manufacturing Company, Ltd., Hsin-Chu (TW)

(72) Inventors: Bo-Jiun Lin, Jhubei (TW); Ching-Yu Chang, Yuansun Village (TW); Hai-Ching Chen, Hsin-Chu (TW); Tien-I Bao, Dayuan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 31 days.

(21) Appl. No.: 14/583,514

(22) Filed: Dec. 26, 2014

(65) Prior Publication Data
US 2016/0190002 A1 Jun. 30, 2016

(51) Int. Cl.
*H01L 21/768* (2006.01)
*H01L 21/02* (2006.01)
*H01B 3/20* (2006.01)
*H01L 23/532* (2006.01)

(52) U.S. Cl.
CPC ........ *H01L 21/76837* (2013.01); *H01B 3/20* (2013.01); *H01L 21/02118* (2013.01); *H01L 21/02211* (2013.01); *H01L 21/02214* (2013.01); *H01L 21/02282* (2013.01); *H01L 21/76802* (2013.01); *H01L 21/76877* (2013.01); *H01L 21/76885* (2013.01); *H01L 23/5329* (2013.01); *H01L 21/76834* (2013.01); *H01L 21/76852* (2013.01); *H01L 23/53233* (2013.01)

(58) Field of Classification Search
CPC ......... H01L 21/02109; H01L 21/02296; H01L 21/70; H01L 21/702; H01L 21/71
See application file for complete search history.

(56) References Cited

U.S. PATENT DOCUMENTS

| | | | |
|---|---|---|---|
| 6,281,115 B1* | 8/2001 | Chang | H01L 21/76831 257/E21.244 |
| 6,420,251 B1* | 7/2002 | Elmadjian | H01L 21/76801 257/E21.259 |
| 7,557,035 B1* | 7/2009 | Ryan | H01L 21/3105 257/E21.579 |
| 2004/0082756 A1* | 4/2004 | Sezi | C08G 69/26 528/363 |
| 2013/0230987 A1* | 9/2013 | Draeger | H01L 21/02126 438/694 |
| 2014/0252624 A1 | 9/2014 | Huang et al. | |

* cited by examiner

Primary Examiner — Cheung Lee
(74) Attorney, Agent, or Firm — Slater Matsil, LLP

(57) ABSTRACT

A method for forming an interconnect structure includes forming a patterned layer over a substrate, the patterned layer having an opening therein. A dielectric material is filled in the opening. The dielectric material has a precursor and a solvent, the solvent having a boiling point temperature greater than a precursor cross-linking temperature. A thermal treatment is performed on the dielectric material to form a dielectric layer.

20 Claims, 13 Drawing Sheets

HIGH BOILING TEMPERATURE SOLVENT ADDITIVES FOR SEMICONDUCTOR PROCESSING

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Isolation structures provide for electrical isolation between devices in the wafer. In metal interconnect structures, one or more openings may be formed in metal layers and then filled with a low-k dielectric material using spin-on-dielectric (SOD) technology, as an example. The low-k dielectric material may help to electrically isolate various features of the meal interconnect structures from each other.

Due to the large numbers of devices that are present on a semiconductor substrate and the continual increase in the integration density of various electronic components (e.g., transistors, diodes, resistors, capacitors, etc.) by continual reductions in minimum feature size, the space between the devices is getting narrower. Because of this, isolation of the devices from each other is becoming increasingly difficult. For example, in high aspect ratio openings it is becoming difficult to uniformly deposit the dielectric material in the openings, leading to voids being formed in the dielectric materials. Such voids adversely affect isolation of the devices which may in turn affect the overall structural integrity of the integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
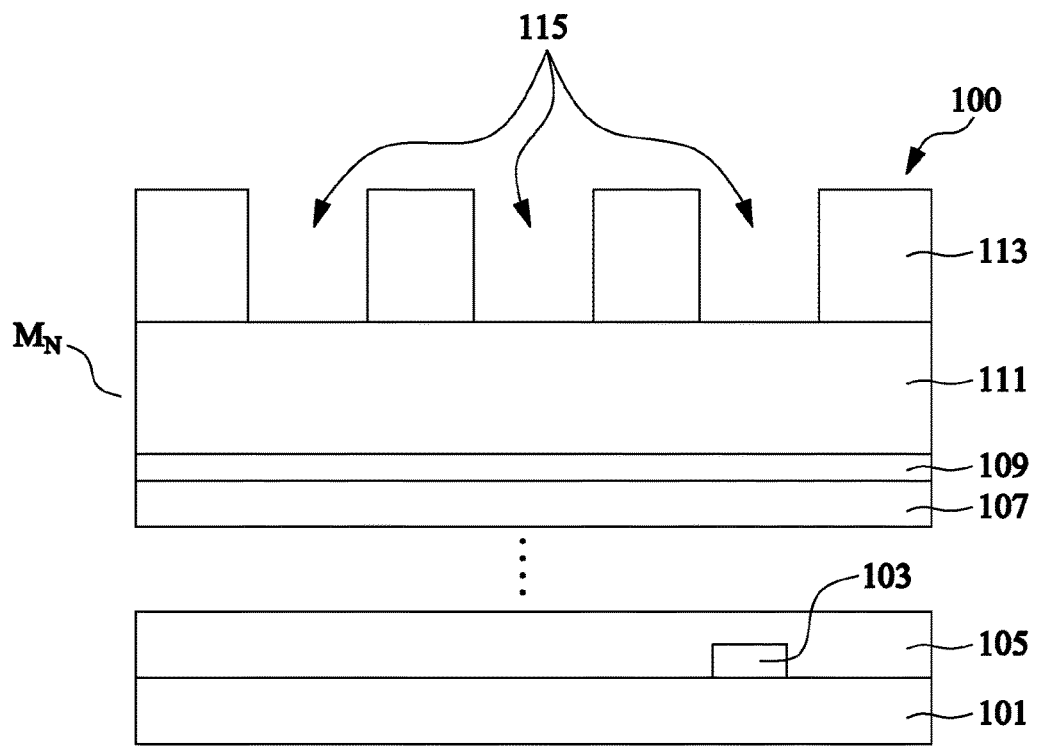
FIGS. 1-10 illustrate various cross-sectional views of a fabrication process of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor devices and methods of forming the same are provided in accordance with various embodiments. In particular, the intermediate stages of forming interconnect structures in semiconductor devices are illustrated. In addition, various method of forming dielectric layers, such as, for example, intermetal dielectric (IMD) layers are described. However, one skilled in the art will recognize that similar methods may also be applied to form, for example, shallow trench isolation (STI) regions in a substrate to isolate various active and passive devices formed on the substrate, STI regions that isolate fins in a fin device, or the like. Throughout the various views and illustrative embodiments, like reference numbers are used to designate like elements.

FIGS. 1-10 illustrate various cross-sectional views of a fabrication process of a semiconductor device 100 in accordance with some embodiments. With reference to FIG. 1, there is shown the semiconductor device 100 at an intermediate stage of processing in accordance with some embodiments. The semiconductor device 100 includes a substrate 101, which may be a part of a wafer. The substrate 101 may be formed of silicon, although it may also be formed of other group III, group IV, and/or group V elements, such as germanium, gallium, arsenic, and combinations thereof. The substrate 101 may also be in the form of silicon-on-insulator (SOI). Generally, an SOI substrate comprises a layer of a semiconductor material (e.g., silicon, germanium and/or the like) formed on an insulator layer. The insulator layer may be, for example, a buried oxide (BOX) layer or a silicon oxide layer. In addition, other substrates that may be used include multi-layered substrates, gradient substrates, hybrid orientation substrates, any combinations thereof and/or the like. Only a portion of the substrate 101 is illustrated in FIGS. 1-10, as this is sufficient to fully describe the illustrative embodiments.

The substrate 101 may include devices 103 formed thereon. As one of ordinary skill in the art will recognize, the devices 103 may include wide variety of active and passive devices such as transistors, diodes, capacitors, resistors, combinations of these, and the like. The devices 103 may be used to generate the structural and functional requirements of the design for the semiconductor device 100. The devices 103 may be formed using any suitable methods, such as CMOS methods, MEMS methods, or the like.

An interlayer dielectric (ILD) 105, an etch stop layer (ESL) 107, a first barrier layer 109, and a first conductive layer 111 may be formed over the substrate 101. In some embodiments, The ILD 105 may be formed on the substrate 101 and the devices 103. The ILD 105 may be formed of dielectric materials such as silicon oxide, borophosphosilicate glass (BPSG), undoped silicate glass (USG), fluorinated silicate glass (FSG), low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The ILD 105 may be deposited by chemical vapor deposition (CVD), physical vapor deposition (PVD), atomic layer deposition (ALD), a spin-on-dielectric (SOD) process, the like, or a combination thereof.

The ESL 107 may be deposited over the ILD 105. In some embodiments, the ESL 107 may be formed directly on top of the ILD 105. In other embodiments, the ESL 107 may be formed on intermediate layers and/or structures (not shown) which are formed on the ILD 105. The ESL 107 may act as an etch stop layer for the subsequent patterning of the first conductive layer 111 (see FIG. 2). The ESL 107 may be made of one or more suitable dielectric materials such as silicon oxide, silicon carbide, oxygen doped silicon carbide, nitrogen doped silicon carbide, silicon nitride, silicon oxynitride, aluminum oxide, aluminum nitride, aluminum oxynitride, combinations of these, or the like. The ESL 107 may be deposited through a process such as CVD, an SOD process, although any acceptable process may be utilized to form the ESL 107.

The first barrier layer 109 may be formed on the ESL 107. The first barrier layer 109 may help to block diffusion of the subsequently formed first conductive layer 111 into adjacent dielectric materials (such as the ESL 107 or a dielectric material, which is subsequently formed over the first conductive layer 111). The first barrier layer 109 may comprise titanium, titanium nitride, tantalum, tantalum nitride, manganese, manganese oxide, cobalt, cobalt oxide, cobalt nitride, nickel, nickel oxide, nickel nitride, silicon carbide, oxygen doped silicon carbide, nitrogen doped silicon carbide, silicon nitride, aluminum oxide, aluminum nitride, aluminum oxynitride, a polymer such as polyimide, polybenzoxazole (PBO) the like, or a combination thereof. The first barrier layer 109 may be formed by CVD, PVD, plasma enhanced CVD (PECVD), ALD, SOD, the like, or a combination thereof. In other embodiments, the first barrier layer 109 may be omitted.

The first conductive layer 111 may be formed on the first barrier layer 109. The first conductive layer 111 may also be referred to as an $N^{th}$ metal layer $M_N$ and may be the first metal layer ($M_1$) over the substrate 101 or any metal layer over the substrate 101 (e.g. $M_5$, $M_{10}$, $M_{100}$). For example, in some embodiments where the ESL 107 is directly formed on top of the ILD 105, the first conductive layer 111 is the first metal layer $M_1$. In some embodiments, the first conductive layer 111 may be in electrical contact with other conductive layers (not shown) formed below the first conductive layer 111. For example, the other conductive layers may be other metal or via layers.

In some embodiments, the first conductive layer 111 may include copper (Cu), aluminum (Al), tungsten (W), or other suitable conductive material. In an exemplary embodiment, the first conductive layer 111 includes copper or copper alloy, such as copper manganese (CuMn), copper aluminum (CuAl), copper silicon (CuSi), copper titanium (CuTi), copper chromium (CuCr), or copper niobium (CuNb), and the like. In some embodiments where the first conductive layer 111 includes copper manganese alloy, a concentration of Mn in the copper manganese alloy ranges between about 0.5% and about 2% by weight. The first conductive layer 111 may be formed through a deposition process such as electroless plating, electrochemical plating, CVD, PVD, the like, or a combination thereof. In some embodiments, the first conductive layer 111 may be formed on a seed layer (not shown). The seed layer may comprise copper, titanium, nickel, gold, manganese, the like, or an alloy thereof, and may be formed by ALD, PVD, the like, or a combination thereof. In some embodiments, the first conductive layer 111 may be formed to a thickness from about 100 Å to about 20000 Å. In some embodiments, the first conductive layer 111 may be planarized by a chemical mechanical polish (CMP) process, an etching process, or the like.

Figure 2:
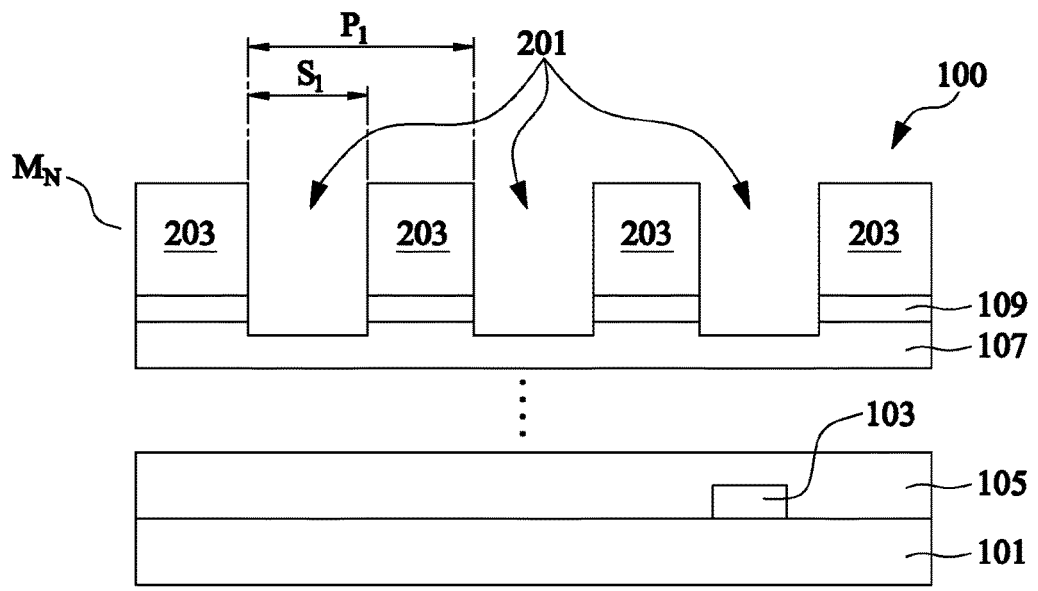

After the first conductive layer 111 is formed, the first conductive layer 111 and the first barrier layer 109 may be patterned as illustrated in FIGS. 1 and 2. As illustrated in FIG. 1, a first photoresist 113 may be deposited and patterned over the first conductive layer 111. The first photoresist 113 may comprise a conventional photoresist material, such as a deep ultra-violet (DUV) photoresist, and may be deposited on the surface of the first conductive layer 111, for example, by using a spin-on process. However, any other suitable material or method of forming or placing the first photoresist 113 may alternatively be utilized. Once the first photoresist 113 has been formed on the first conductive layer 111, the first photoresist 113 may be exposed to energy, e.g. light, through a patterned reticle in order to induce a reaction in those portions of the first photoresist 113 that are exposed to the energy. The first photoresist 113 may then be developed, and portions of the first photoresist 113 may be removed to form first openings 115 and to expose portions of the first conductive layer 111 through the first openings 115. Additional masking layers, e.g., hard masks, may also be used.

Referring to FIG. 2, after the first photoresist 113 is patterned, the first conductive layer 111 and the first barrier layer 109 may be patterned to expose a top surface of the ESL 107. The patterning of the first conductive layer 111 forms second openings 201 in the first conductive layer 111. Each of the second openings 201 separates neighboring first conductive lines 203. In some embodiments, the first conductive lines 203 may have a spacing $S_1$ (which also equals to a width of the second openings 201) between adjacent first conductive lines 203 in a range from about 3 nm to about 30 nm and a pitch $P_1$, which is the spacing $S_1$ in addition to a first conductive line 203 width, in a range from about 3 nm to about 30 nm. Although FIG. 2 illustrates four first conductive lines 203, there may be more or less first conductive lines 203 depending on the number of the first conductive lines 203 that are desired.

In some embodiments, the patterning of the first conductive layer 111 may be performed by a dry etch process such as a plasma etch process. In some embodiments where the first conductive layer 111 comprises copper, a copper etch gas includes a hydrogen containing gas, such as $C_xH_y$, $C_xF_y$, $C_xH_yF_z$, or combinations thereof. Each of the subscripts x, y, and z has a value greater than 0 and less than 6. For simplicity, the subscripts x, y, and z may be omitted in the following description. In such embodiments, the copper etch gas may include CO and/or $O_2$, and $N_2$ and/or Ar. In some embodiments, a flow rate for the hydrogen containing gas ranges between about 1 sccm and about 100 sccm, a flow rate of CO (or $O_2$) ranges between about 1 sccm and about 500 sccm, and a flow rate of $N_2$ (or Ar) ranges between about 1 sccm and about 1000 sccm. In some embodiments, the plasma etch is performed at a temperature (substrate temperature) between about 20° C. and about 250° C. In other embodiments, the plasma etch is performed at a temperature between about 20° C. and about 80° C.

Apart from the patterning method described above for patterning the first conductive layer 111 to form the first conductive lines 203, alternative patterning methods may also be utilized. For example, in some embodiments, a wet etch process may be alternatively or additionally used to pattern the first conductive layer 111. In other embodiments with the first conductive layer 111 including suitable metals, such as aluminum or tungsten, other etch gases may be used. In addition, in some embodiments, one or more hard masks (not shown), such as silicon oxide, silicon carbide, silicon nitride, titanium nitride, or tantalum nitride may be formed on the first conductive layer 111 to assist the pattering process. The first photoresist 113 is thereafter removed by, for example, an ashing processes followed by a wet clean process.

Figure 3:
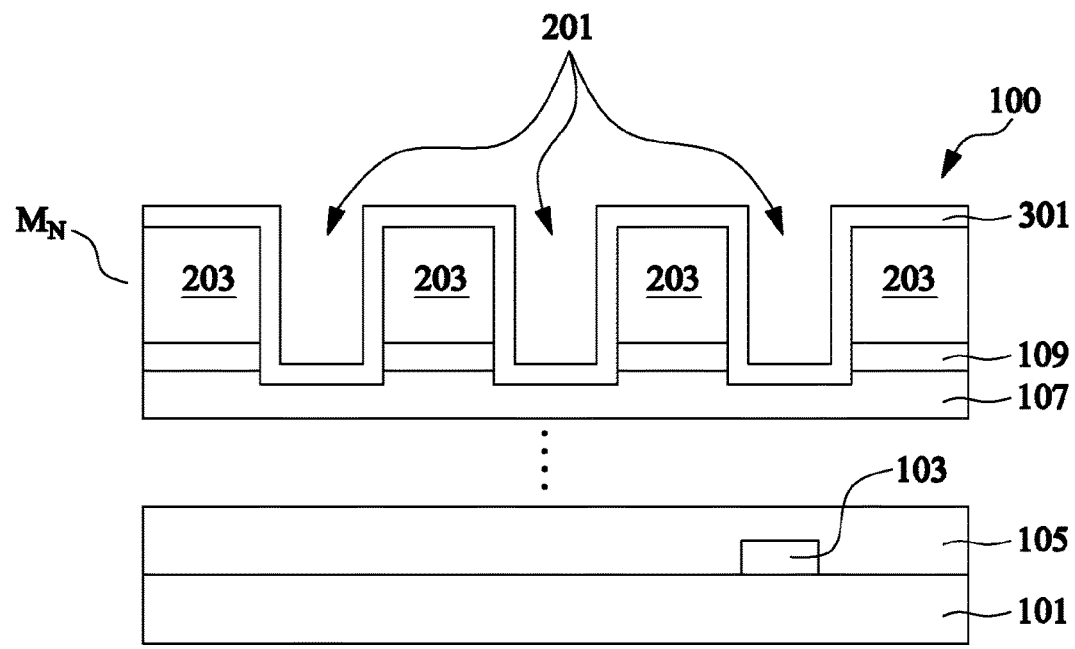

Referring to FIG. 3, after the first conductive lines 203 are formed, a second barrier layer 301 may be formed on top surfaces and sidewalls of the first conductive lines 203 and in bottoms of the second openings 201 on exposed portions of the ESL 107. The second barrier layer 301 may help to block diffusion of the first conductive lines 203 into adjacent dielectric materials, such as the subsequently formed first intermetal dielectric (IMD) 501 (see FIG. 5). The second barrier layer 301 may be formed using similar materials and methods as the first barrier layer 109 and the description is not repeated herein. In some embodiments, the second barrier layer 301 is formed on sidewalls of the first barrier layer 109 under the first conductive lines 203.

Figure 4:
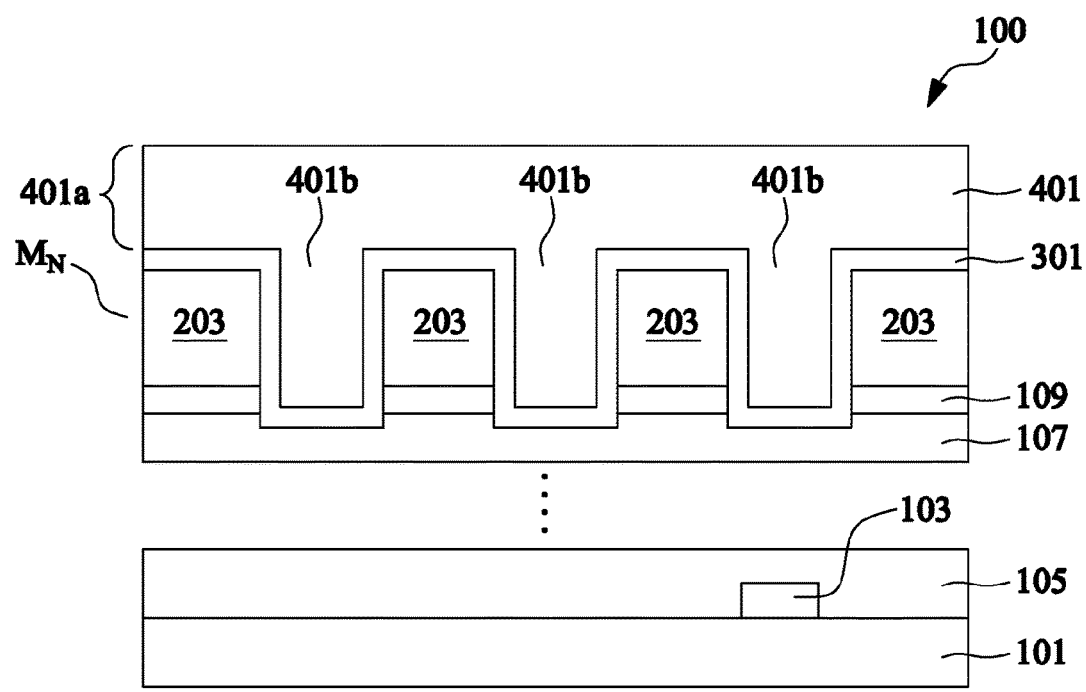
Figure 5:
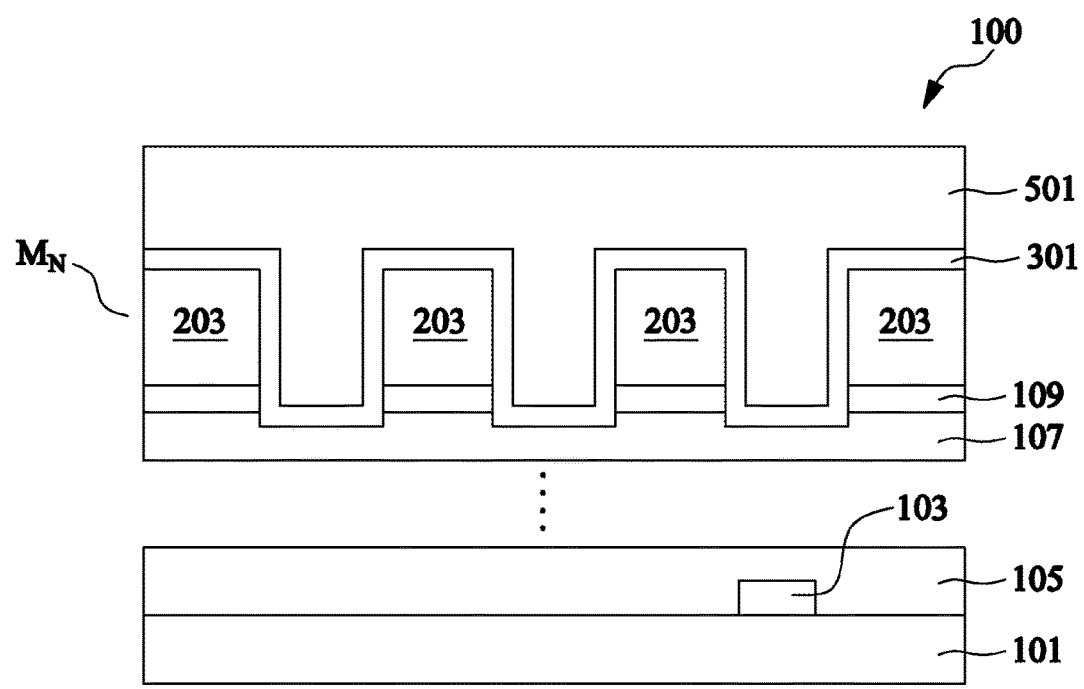
Figure 6:
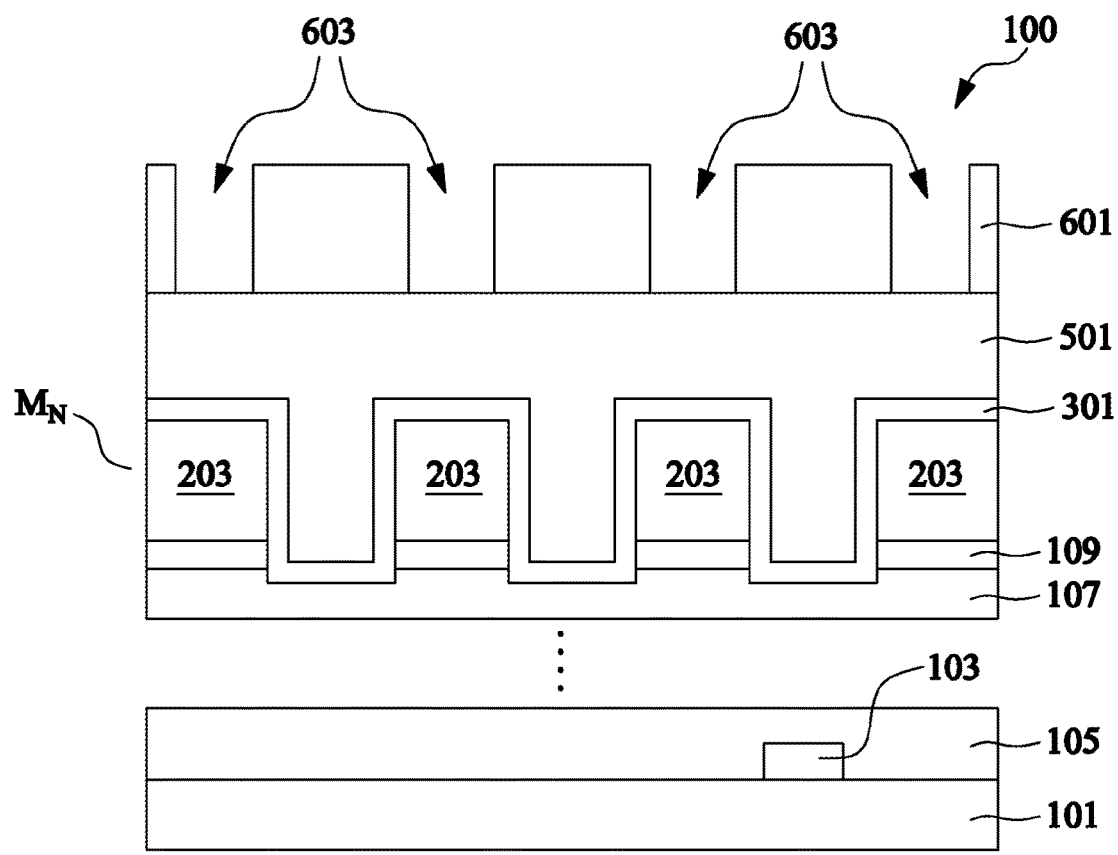

Referring to FIGS. 4 and 5, after the second barrier layer 301 is formed, the first IMD 501 may be formed in the second openings 201 and on the first conductive lines 203. In some embodiments, the first IMD 501 may comprise a low-k dielectric material, such as phosphosilicate glass (PSG), borophosphosilicate glass (BPSG), fluorinated silicate glass (FSG), SiOxCy, spin-on-dielectric, spin-on-glass, spin-on-polymer, silicon carbon material, compounds thereof, composites thereof, combinations thereof, or the like, by any suitable method, such as a spin-on-dielectric (SOD) process, CVD, PECVD, or the like.

Referring further to FIG. 4, a spin-on low-k dielectric material 401 is deposited by an SOD process on the first conductive lines 203 to substantially fill the second openings 201. In some embodiments, the spin-on low-k dielectric material 401 comprises a precursor matrix and a high boiling point (HBP) solvent. The spin-on low-k dielectric material 401 may include a precursor matrix for a low-k dielectric material, a porous low-k material, spin-on-dielectric, spin-on-glass, spin-on-polymer, combinations of these, or the like. Prior to performing an SOD process to deposit the spin-on low-k dielectric material 401 onto the semiconductor device 100, the spin-on low-k dielectric material 401 may be formed by one or more methods described below with reference to FIGS. 11-13.

Figure 11:
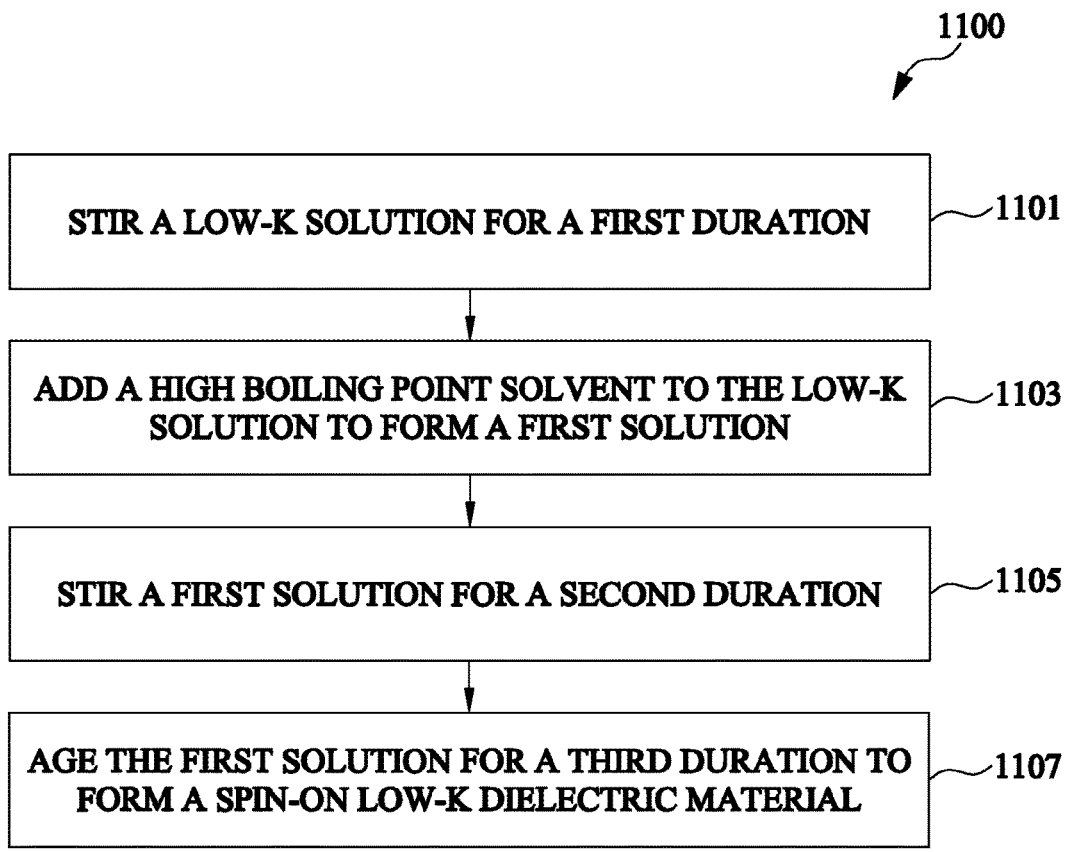
FIG. 11 is a flow diagram illustrating a first method of forming a spin-on low-k material in accordance with some embodiments.

FIG. 11 is a flow diagram illustrating a first method 1100 of forming the spin-on low-k dielectric material 401 in accordance with some embodiments. In some embodiments, the spin-on low-k dielectric material 401 is formed by mixing a HBP solvent with a low-k solution containing a precursor matrix and a solvent. In some embodiments, the precursor includes tetraethyl orthosilicate (TEOS), perhydro-polysilazane, tetramethoxysilane (TMOS), methyltrimethoxysilane (MTMS), methyltriethoxysilane (MTES), bis-triethoxysilyl methane, bis-triethoxysilyl ethane, alkoxysilane, bis-triethoxysilyl benzene, monomers with a bridging organic group, combinations of these, or the like. In some embodiments, the solvent includes ethanol, isopropanol, propanol, butanol, combinations of these, or the like. As described below in greater detail, after depositing the spin-on low-k dielectric material 401 over the semiconductor device 100, the spin-on low-k dielectric material 401 undergoes various processes, such as soft baking and curing, which thermally treat the spin-on low-k dielectric material 401 to form the first IMD 501. In some embodiments, the spin-on low-k dielectric material 401 is heated to a temperature about or larger than a cross-linking temperature. The cross-linking temperature is a temperature at which the precursor matrix cross links to form a three dimensional cross-linked structure. The cross-linking temperature varies with different precursor chemistries used and with different process parameters.

Referring further to FIG. 11, in step 1101, the low-k solution is stirred for from about 20 minutes to about 2 hours, such as 30 minutes, to thoroughly mix the precursor matrix and the solvent. After the low-k solution has been stirred, in step 1103, a HBP solvent is added to the low-k solution to form a first solution. In some embodiments, a HBP solvent is a solvent that has a boiling point temperature greater than the cross-linking temperature. In some embodiments, the cross-linking temperature is greater than about 150° C. In some embodiments wherein the HBP solvent is not added to the low-k solution, the solvent of the low-k solution begins to evaporate when the low-k solution is heated above the cross-linking temperature. Such evaporation may lead to formation of voids in the three dimensional cross-linked structure and, therefore, in the first IMD 501. In some embodiments, the voids are predominantly formed within the second openings 201, since a rate of solvent evaporation is higher in a portion of low-k solution within constrictions (such as second openings 201) than in a bulk of the low-k solution. In some embodiments wherein the HBP solvent is added to the low-k solution, after increasing the first solution's temperature at or above the cross-linking temperature, the HBP solvent evaporation will be reduced or eliminated and, therefore, voids will be reduced or eliminated. In other words, since the HBP solvent remains in the solution at the cross-linking temperature, void formation in the first IMD 501 is reduced or eliminated.

The HBP solvent is chosen to have a boiling point temperature larger than the cross-linking temperature of a precursor matrix used to form the spin-on low-k dielectric material 401. In some embodiments, the HBP solvent has a boiling point temperature greater than about 200° C. In some embodiments, the HBP solvent includes benzonitrile ($C_7H_5N$), benzyl alcohol ($C_7H_8O$), propyl benzoate ($C_{10}H_{12}O_2$), ethyl benzoate ($C_9H_{10}O_2$), diethylene glycol ($C_4H_{10}O_3$), 3-phenyl-1-propanol ($C_9H_{12}O$), N-Methyl-2-pyrrolidone (NMP) ($C_5H_9NO$), combinations of these, or the like.

Table I shows a list of HBP solvents, their chemical names, formulas and boiling points (° C.). It is understood that this is not an exhaustive list of the HBP solvents having a high boiling point, for example, above 200° C. but that other HBP solvents having a boiling point greater than the cross-linking temperature are also contemplated and within the scope of the present disclosure.

TABLE I

| HBP Solvent | Formula | Boiling Point (° C.) |
| --- | --- | --- |
| Benzonitrile | $C_7H_5N$ | 205 |
| Benzyl alcohol | $C_7H_8O$ | 205.4 |
| Propyl benzoate | $C_{10}H_{12}O_2$ | 230 |
| Ethyl benzoate | $C_9H_{10}O_2$ | 213 |
| Diethylene glycol | $C_4H_{10}O_3$ | 245 |
| 3-phenyl-1-propanol | $C_9H_{12}O$ | 235 |
| N-Methyl-2-pyrrolidone (NMP) | $C_5H_9NO$ | 202 |

In some embodiments, an adequate amount of the HBP solvent needs to be added to the low-k solution to prevent void formation. In some embodiments, the amount of the HBP solvent added to the low-k solution is greater than about 5% by weight, such as about 20% by weight, of the spin-on low-k dielectric material 401.

In some embodiments, after the HBP solvent is added to the low-k solution (containing the precursor matrix and the solvent) to form the first solution, in step 1105, the first solution is stirred for a duration of about 20 minutes to about 2 hours, such as about 30 minutes. Thereafter, in step 1107, the first solution (containing the HBP solvent) is aged in order to keep the solution stable and to produce the spin-on low-k dielectric material 401 that will be later spun on the semiconductor device 100. In some embodiments, the first solution (containing the HBP solvent) is allowed to sit (age) for a duration of about 2 hours to about 24 hours.

Figure 12:
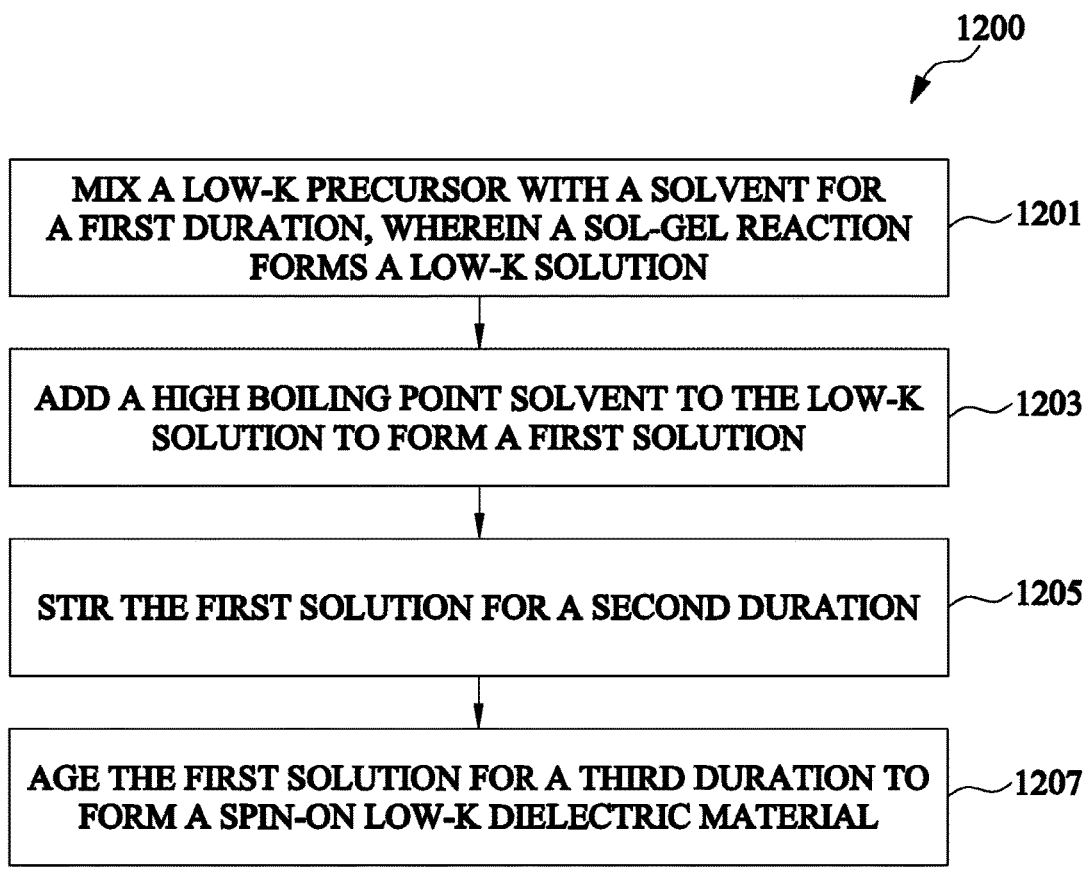
FIG. 12 is a flow diagram illustrating a second method of forming a spin-on low-k material in accordance with some embodiments.

FIG. 12 is a flow diagram illustrating a second method 1200 of forming the spin-on low-k dielectric material 401 in accordance with some embodiments. The second method starts at step 1201, wherein a low-k solution is formed. In some embodiments, the low-k solution is formed by mixing a precursor with a solvent for a pre-determined duration, wherein a sol-gel reaction produces a precursor matrix. In some embodiments, the precursor is added and mixed with the solvent for about 1 hour to about 24 hours. The precursor and the solvent chemistries in these embodiments are essentially the same as the chemistries employed in the first method 1100 discussed above, and the details of these chemistries are not repeated herein.

In step 1203, a HBP solvent is added to the low-k solution (including the precursor matrix and the solvent) to form a first solution. In some embodiments, the HBP solvent includes the solvents shown in Table I above. In step 1205, the first solution (containing the HPB solvent) is stirred for a pre-determined duration. In step 1207, the first solution (containing the HBP solvent) is aged in order to keep the solution stable and to produce the spin-on low-k dielectric material 401 that will be later spun on the semiconductor device 100. Steps 1203, 1205 and 1207 of the second method 1200 are similar to steps 1103, 1105 and 1107 of the first method 1100, respectively, and the description is not repeated herein.

Figure 13:
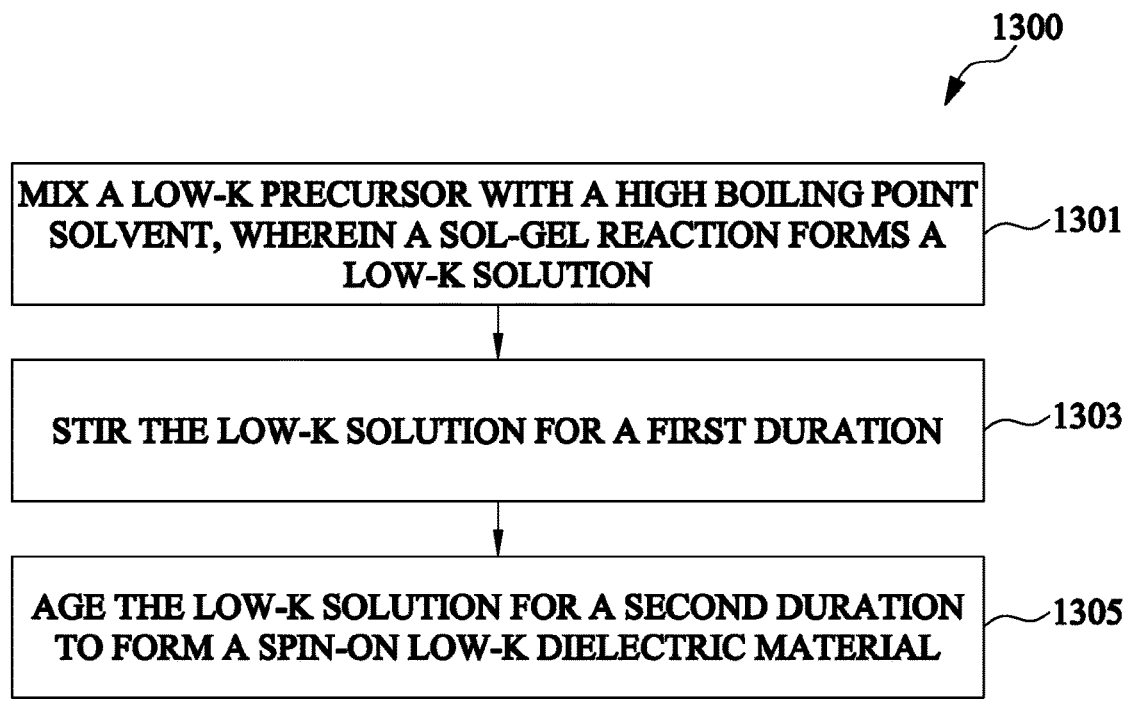
FIG. 13 is a flow diagram illustrating a third method of forming a spin-on low-k material in accordance with some embodiments.

FIG. 13 is a flow diagram illustrating a third method 1300 of forming the spin-on low-k dielectric material 401 in accordance with some embodiments. The third method 1300 starts at step 1301, wherein a low-k solution is formed. In some embodiments, the low-k solution is formed by mixing a precursor with a HBP solvent for a pre-determined duration, wherein a sol-gel reaction produces a precursor matrix. In some embodiments, the precursor is added and mixed with the HBP solvent for from about 1 hour to 24 hours. The precursor and the HBP solvent chemistries in these embodiments are essentially the same as the chemistries employed in the first method 1100 discussed above, and the details of these chemistries are not repeated herein.

In step 1303, the low-k solution (containing the HPB solvent) is stirred for a pre-determined duration. Subsequently, in step 1305, the low-k solution (containing the HBP solvent) is aged in order to keep the solution stable and to produce the spin-on low-k dielectric material 401 that will be later spun on the semiconductor device 100. Steps 1303 and 1305 of the third method 1300 are similar to steps 1105 and 1107 of the first method 1100, respectively, and the description is not repeated herein.

Referring back to FIG. 4, the low-k dielectric material 401 that is formed by any of the first method 1100, the second method 1200, or the third method 1300 is deposited on the first conductive lines 203 to fill the second openings 201, and the substrate 101 is then spun to evenly distribute the low-k dielectric material 401 over the substrate. In some embodiments, the substrate 101 is spun at a spin rate of between about 750 rpm and about 6000 rpm for a period of 5 seconds to a minute. It is understood that the substrate 101 may be spun at different spin rates for different durations, with these parameters depending on the concentration and viscosity of the solution being applied and the desired thickness of the resulting first IMD 501 (see FIG. 5).

In some embodiments, the spin-on low-k dielectric material 401 is applied onto the semiconductor device 100 using a spray coating or mist deposition process. In other embodiments, the spin-on low-k dielectric material 401 is applied onto the semiconductor device 100 using a dip coating process. The spin-on low-k dielectric material 401 includes a first portion 401a over top surfaces of the first conductive lines 203 and a second portion 401b inside the second openings 201. In some embodiments, the first portion 401a of the spin-on low-k dielectric material 401 is spun on the semiconductor device 100 to a thickness of from about 300 Å to about 5000 Å. In other embodiments, the first portion 401a of the spin-on low-k dielectric material 401 is spun on the semiconductor device 100 to a thickness of from about 500 Å to about 2000 Å.

The spin-on low-k dielectric material 401 is in a liquid form, and hence may need to undergo one or more thermal treatments to convert the spin-on low-k dielectric material 401 into a solid and stable form. Referring to FIG. 5, in some embodiments, the semiconductor device 100 undergoes a soft bake or a heating process. The heating source may include an ultraviolet (UV) light source, an infrared light source, one or more heater coils, other suitable radiation sources, or a combination thereof. In some embodiments, the substrate 101 is transferred to a hot plate for baking. In other embodiments, an oven may be used to perform the soft baking if it is desirable to control the ambient temperature. In some embodiments, the soft baking is performed at a temperature between about 60° C. and about 200° C. for a duration of about 30 seconds to about 10 minutes. In other embodiments, the soft baking is performed at a temperature of about 200° C. for about 2 minutes. An optional drying step may be performed between the coating and baking steps. The drying will generally comprise a heating on a hot plate or in an oven for about 30 seconds to about a few minutes at a lower temperature than the soft bake step. In some embodiments, the drying is performed at about 120° C. In some embodiments, during the soft bake process, as the temperature is increased the precursor matrix of the spin-on low-k dielectric material 401 begins to cross link at a temperature above 150° C. At the cross-linking temperature, the solvent in the spin-on low-k dielectric material 401 begins to evaporate leaving behind the precursor matrix and the HBP solvent. In some embodiments, the soft baking is performed at a temperature that is greater than the cross-linking temperature (such as, for example, 150° C.), but smaller than a boiling point temperature of the HBP solvent (such as, for example, 200° C.). In such an embodiment, the HBP solvent evaporation is reduced or eliminated during the soft bake process and void formation in the first IMD 501 is reduced or avoided.

In some embodiments where the spin-on low-k dielectric material 401 comprises an alkoxysilane [$Si(OR)_n$], such as, for example, TEOS [$Si(OR)_4$, with R=$C_2H_5$], the soft bake process converts the alkoxysilane to a three dimensional cross-linked structure. The soft bake process cross links $Si(OR)_4$ monomers into a three dimensional structure by linking the monomers by Si—O—Si bonds. An exemplary cross-linking reaction may be expressed by the following equations:

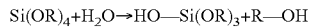

Si(OR)$_4$+H$_2$O→HO—Si(OR)$_3$+R—OH

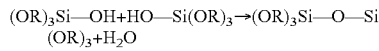

(OR)$_3$Si—OH+HO—Si(OR)$_3$→(OR)$_3$Si—O—Si(OR)$_3$+H$_2$O

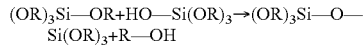

(OR)$_3$Si—OR+HO—Si(OR)$_3$→(OR)$_3$Si—O—Si(OR)$_3$+R—OH

Figure 14:
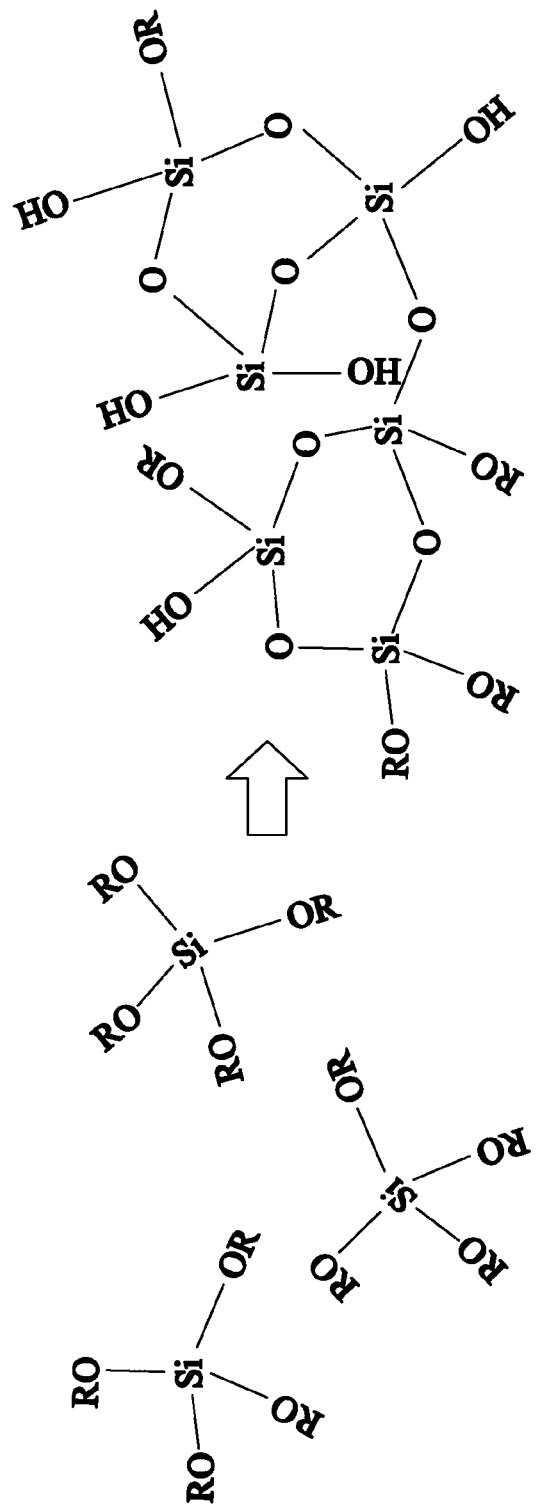
FIG. 14 is a schematic illustration of material structures before and after a cross-linking reaction in accordance with some embodiments.

The structure of the materials before and after the cross-linking reaction is schematically illustrated in FIG. 14. In the illustrated embodiment, TEOS monomers in the spin-on low-k dielectric material 401 are cross-linked to form the three dimensional cross linked structure. In some embodiments, after the soft bake process, the spin-on low-k dielectric material 401 may comprises the HBP solvent in addition of the cross-linking reaction byproducts.

Referring further to FIG. 5, in some embodiments, the semiconductor device 100 undergoes a curing process to form the first IMD 501. In some embodiments, during the curing process further cross-linking reactions take place. The curing process also has the function of densifying and improving the mechanical property of the resulting first IMD 501. In some embodiments, the substrate 101 is heated at a temperature from about 300° C. to about 400° C. for a duration of about 2 minutes to about 20 minutes. In some embodiments, the curing process may be performed in an oxygen atmosphere at ambient pressure with a flow rate of about 3 liters per minute to about 6 liters per minute. In some embodiments, the substrate 101 is heated at a temperature of about 200° C. for a duration of about 2 minutes. In some embodiments, the reaction byproducts such as, for example H$_2$O, R—OH and/or the HBP solvent are evaporated after about 400° C., and hence only the three dimensional cross-linked structure remains. Following the curing process to form the first IMD 501, a chemical mechanical polish (CMP) may be performed to planarize the first IMD 501 and prepare the semiconductor device 100 for further processing.

Referring to FIGS. 6-9, after the first IMD 501 is formed, an N$^{th}$ via layer V$_N$ and an (N+1)$^{th}$ metal layer M$_{N+1}$ may be formed over the N$^{th}$ metal layer M$_N$. Referring further FIG. 6, a second photoresist 601 may be deposited and patterned over the first IMD 501 to form third openings 603 exposing portions of the first IMD 501 in the third openings 603. The second photoresist 601 may be formed and patterned similar to the first photoresist 113 as described above and the description is not repeated herein.

Figure 7:
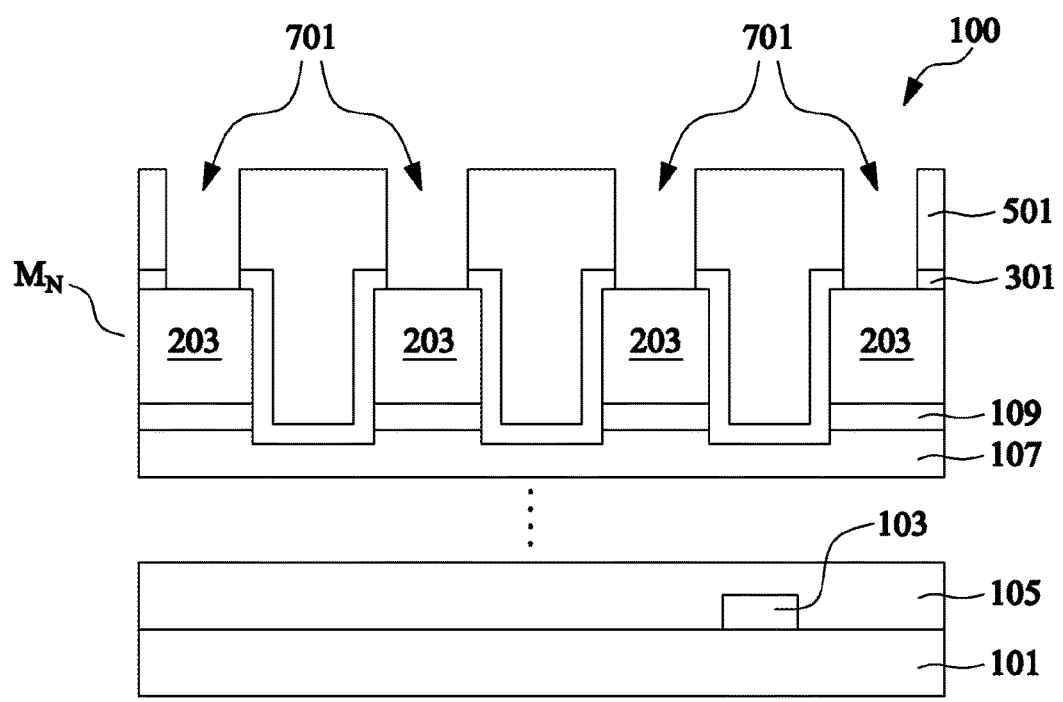

FIG. 7 illustrates the formation of the fourth openings 701 through the first IMD 501 to expose top surfaces of the first conductive lines 203. The fourth openings 701 may be formed using acceptable photolithography and etching techniques such as, for example, an anisotropic dry etch.

Figure 8:
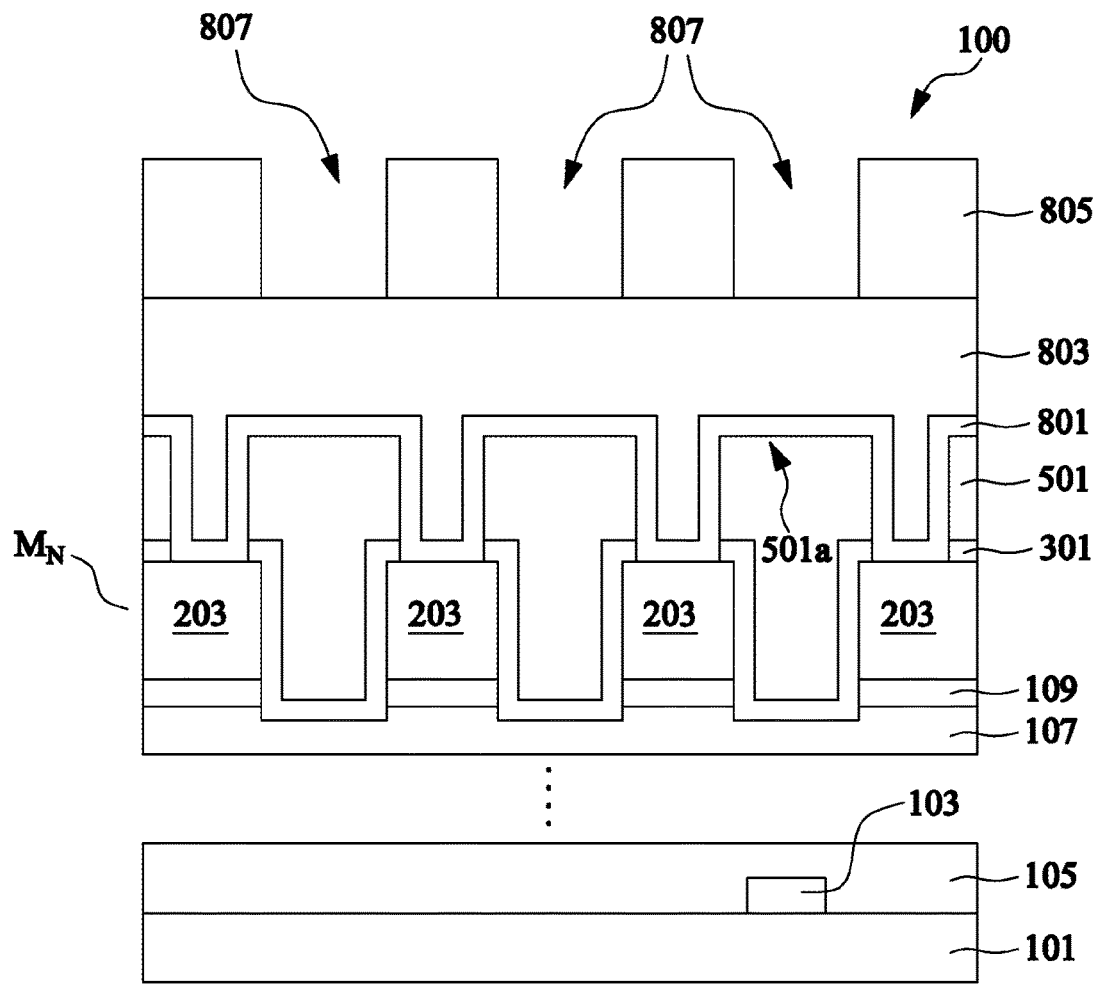

FIG. 8 illustrates the formation of a third barrier layer 801 and a second conductive layer 803 in the fourth openings 701 contacting the top surfaces of the first conductive lines 203 and along a top surface 501a of the first IMD 501. The third barrier layer 801 may be similar to the first barrier layer 109 described above and the description will not be repeated herein. The second conductive layer 803 may be similar to the first conductive layer 111 described above and the description will not be repeated herein, although the first conductive layer 111 and the second conductive layer 803 need not be the same. In some embodiments, the portion of the second conductive layer 803 formed in the fourth openings 701 contacting the top surfaces of the first conductive lines 203 and below the top surface 501a of the first IMD 501 may be referred to as vias.

Figure 9:
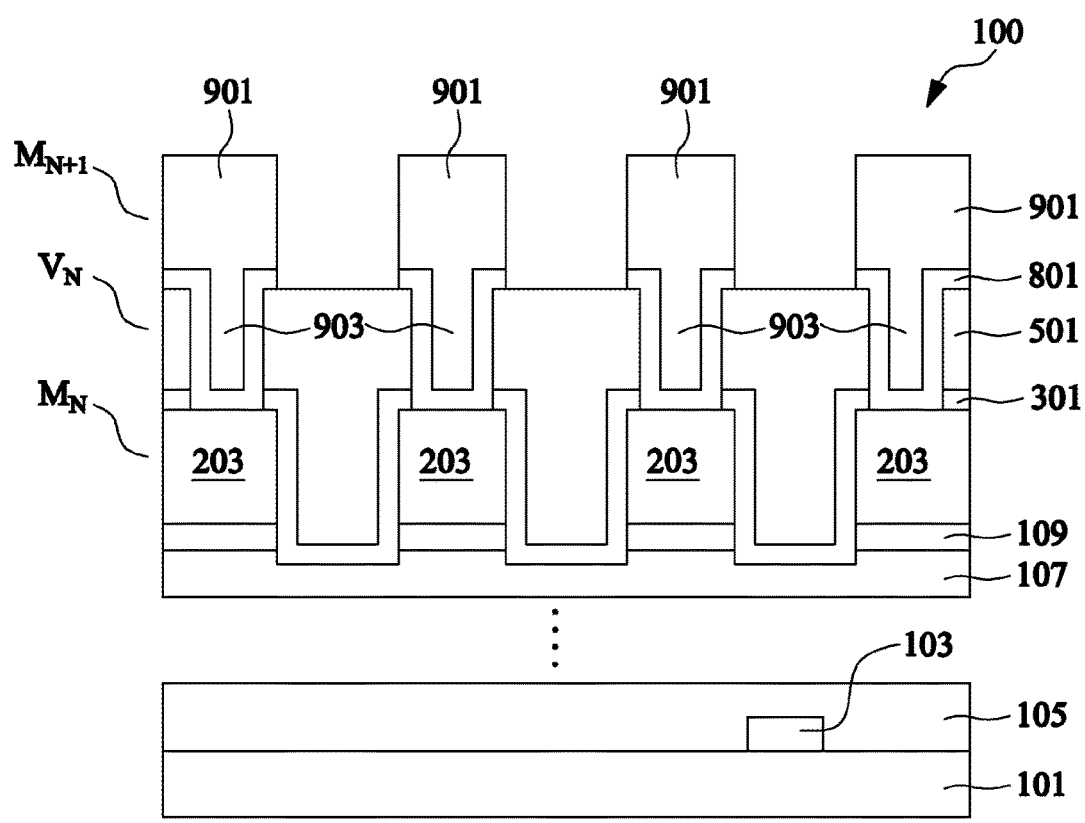

After the second conductive layer 803 is formed, the third barrier layer 801 and the second conductive layer 803 may be patterned to form second conductive lines 901 and conductive vias 903 as illustrated in FIGS. 8 and 9. The second conductive lines 901 form the (N+1)$^{th}$ metal layer M$_{N+1}$, and the conductive vias 903 form the Nth via layer V$_N$. Referring further to FIG. 8, a third photoresist 805 may be deposited and patterned over the second conductive layer 803 to form fifth openings 807 exposing portions of the second conductive layer 803 in the fifth openings 807. The third photoresist 805 may be formed and patterned similar to the first photoresist 113 as described above and the description is not repeated herein.

Referring to FIG. 9, after the third photoresist 805 is patterned, the second conductive layer 803 and the third barrier layer 801 may be patterned to expose a top surface of the first IMD 501. The patterning of the second conductive layer 803 forms the second conductive lines 901. The formation of the second conductive lines 901 may be similar to the formation of the first conductive lines 203 described above and the description is not repeated herein, although the formation of the second conductive lines 901 and the first conductive lines 203 need not be the same.

Figure 10:
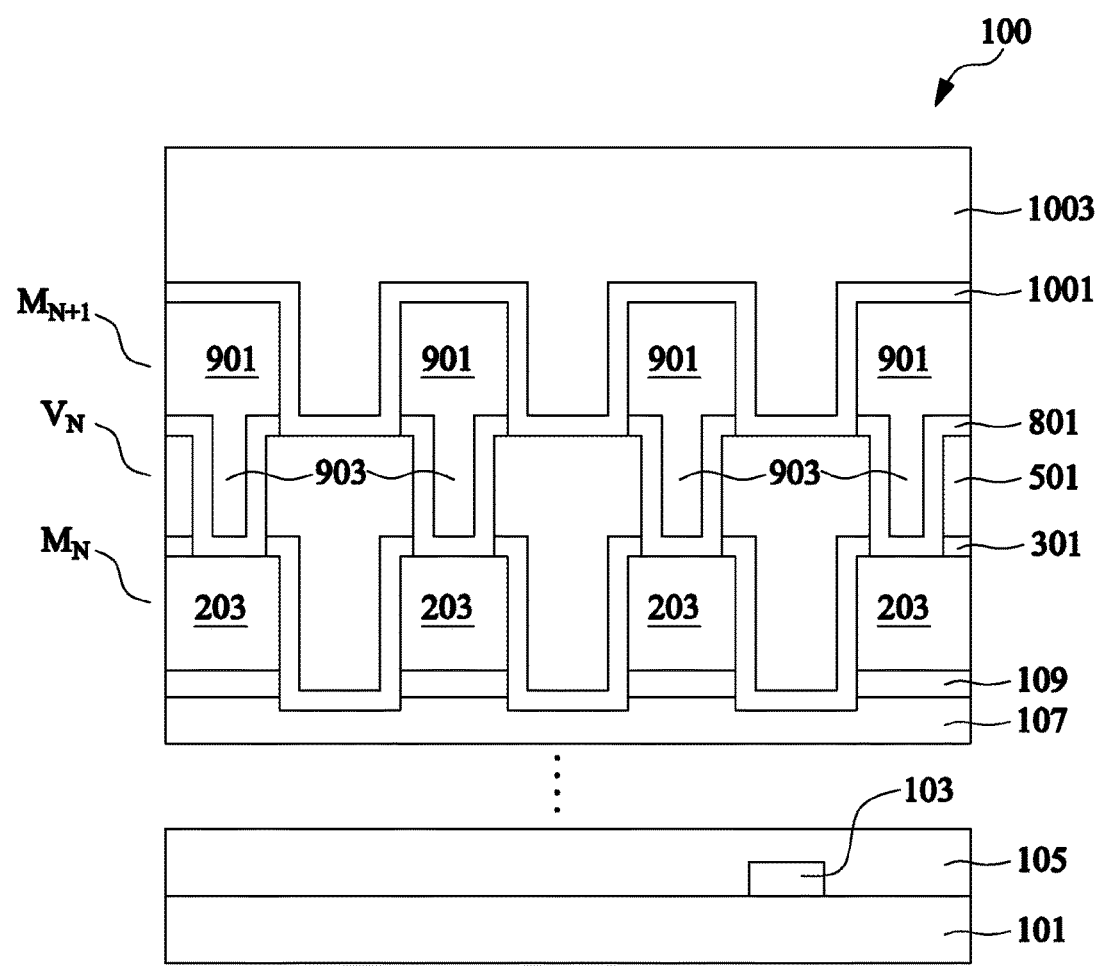

Referring to FIG. 10, after the formation of the second conductive lines 901, a fourth barrier layer 1001 may be formed on top surfaces and sidewalls of the second conductive lines 901 and the top surface of the first IMD 501. The fourth barrier layer 1001 may be similar to the first barrier layer 109 described above and the description is not repeated herein.

Referring further to FIG. 10, after the fourth barrier layer 1001 is formed, a second IMD 1003 may be formed on the fourth barrier layer 1001. In some embodiments, the second IMD 1003 may be formed using similar methods as the first IMD 501 described above and the description is not repeated herein. In other embodiments, the second IMD 1003 and the first IMD 501 may be formed using different methods.

In the illustrated embodiments, two metal layers (such as the metal layers M$_N$ and M$_{N+1}$) and a single via layer (such as the via layer V$_N$) are illustrated. However, in other embodiments, the semiconductor device 100 may include any suitable number of metal and via layers. Additional metal and via layers may be formed in a similar manner as described above.

In some embodiments, further manufacturing steps may be performed on the semiconductor device 100. For example, the further manufacturing steps may include formation of one or more redistribution layers (RDLs) over the metal and via layers, formation of under-bump metallizations (UBMs) over the RLDs, and formation of connectors over the UBMs. Subsequently, the substrate 101 may be singulated into separate dies, which may further undergo various packaging processes.

Figure 15:
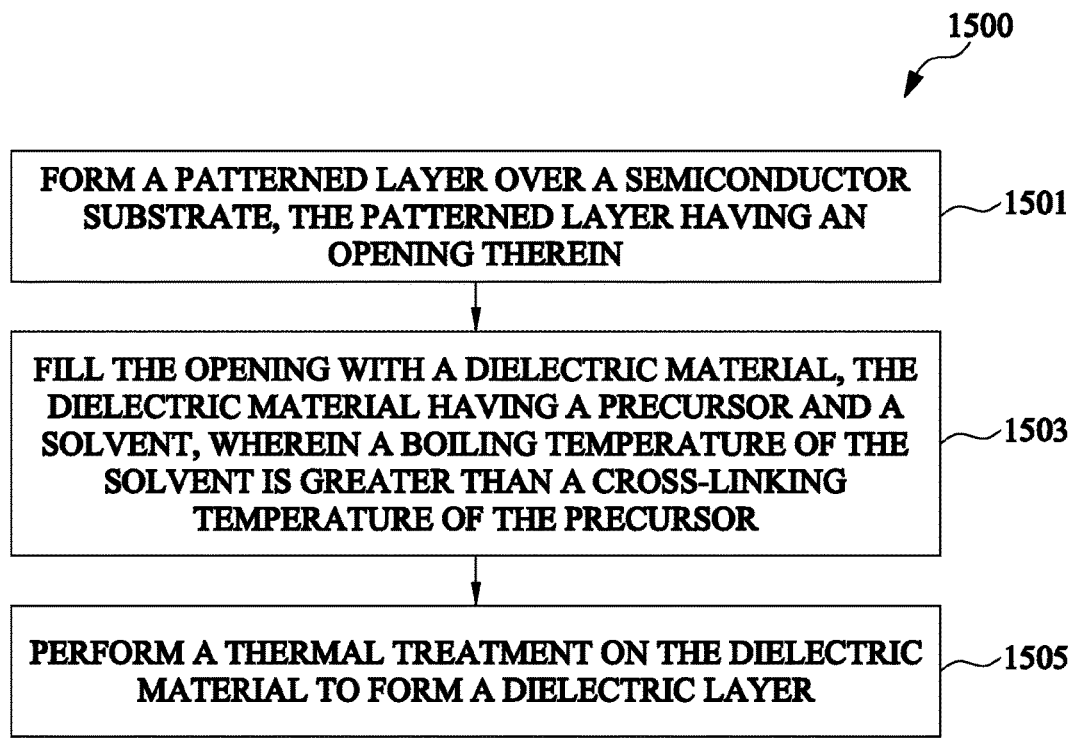
FIG. 15 is a flow diagram illustrating a method of forming a dielectric layer in an interconnect structure in accordance with some embodiments.

FIG. 15 is a flow diagram illustrating a method 1500 of forming a dielectric layer in an interconnect structure in accordance with some embodiments. The method 1500 starts at step 1501, wherein a patterned layer (such as the first conductive lines 203) having an opening (such as the second openings 201) is formed over a substrate (such as the substrate 101) as described above with reference to FIGS. 1 and 2. In step 1503, the opening is filled with a dielectric material (such as the spin-on low-k dielectric material 401), wherein the dielectric material comprises a precursor and a high boiling point solvent as described above with reference to FIGS. 3 and 4. In step 1505, the dielectric material is thermally treated to form the dielectric layer (such as the first IMD 501) as described above with reference to FIG. 5.

Advantages of one or more embodiments of the present disclosure may include one or more of the following. In some embodiments, a spin-on coating process eliminates the formation of voids (that adversely affect the overall structural integrity of the integrated circuits) that may otherwise form in dielectric materials that are deposited in openings of interconnect structures. In some embodiments, spin-on-dielectric process is a more cost-effective way to deposit low-k films than CVD processes. In some embodiments, the method described above is compatible with spin-on porous low-k materials and non-porous spin-on glass materials.

According to an embodiment, a method for forming a dielectric structure, the method comprises forming a patterned layer over a substrate, the patterned layer having an opening therein. The method further comprises filling a dielectric material in the opening, the dielectric material having a precursor and a solvent, the solvent having a boiling point temperature greater than a precursor cross-linking temperature, and performing a thermal treatment of the dielectric material, wherein the thermal treatment induces a cross-linking reaction.

According to another embodiment, a method for forming a dielectric structure, the method comprises forming a layer having an opening over a substrate, and mixing a precursor with a solvent to form a solution, the solvent having a boiling point temperature greater than a first temperature at which the precursor cross-links. The method further comprises spin coating the solution into the opening, baking the solution at a second temperature between the first temperature and the boiling point temperature, and curing the solution at a third temperature greater than the boiling point temperature.

According to yet another embodiment, a spin-on dielectric material for filling an opening, the spin-on dielectric material comprises a precursor mixed with a solvent, wherein the solvent has a boiling point temperature greater than a precursor cross-linking temperature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a dielectric structure, the method comprising:
   forming a first barrier layer over a substrate;
   forming a patterned layer over the first barrier layer, the patterned layer comprising conductive elements, the patterned layer having a first opening therein, the first opening extending through the first barrier layer;
   filling a dielectric material in the first opening, the dielectric material having a precursor and a solvent, the solvent having a boiling point temperature greater than a cross-linking temperature of the precursor;
   performing a thermal treatment of the dielectric material, wherein the thermal treatment induces a cross-linking reaction;
   performing a chemical mechanical polish (CMP) to planarize the dielectric material;
   after performing the thermal treatment, patterning the dielectric material to form a second opening extending to the patterned layer; and
   filling the second opening with a conductive material to form a conductive via.

2. The method of claim 1, wherein the patterned layer is a conductive layer.

3. The method of claim 1, wherein the dielectric material comprises a low-k dielectric material, a porous low-k material, a spin-on-glass material, or a spin-on-polymer material.

4. The method of claim 1, wherein the solvent comprises propyl benzoate (C10H12O2), ethyl benzoate (C9H10O2), diethylene glycol (C4H10O3), N-Methyl-2-pyrrolidone (NMP) (C5H9NO), or combinations thereof.

5. The method of claim 1, wherein the filling the dielectric material into the first opening comprises depositing the dielectric material using a spin-on coating process.

6. The method of claim 1, wherein the solvent has a boiling point temperature above about 200° C.

7. The method of claim 1, wherein an amount of solvent in the dielectric material is greater than about 5% by weight of the dielectric material.

8. The method of claim 1, wherein the cross-linking temperature of the precursor is above about 150° C.

9. The method of claim 1, wherein the performing the thermal treatment comprises:
   heating the substrate at a first temperature between about 60° C. and about 200° C. for a first duration from about 30 seconds to about 10 minutes; and
   curing the substrate at a second temperature from about 300° C. to about 400° C. for a second duration from about 2 minutes to about 20 minutes.

10. A method for forming a dielectric structure, the method comprising:
    forming a layer having a first opening over a substrate;
    mixing a precursor with a solvent to form a solution, the precursor having a cross-linking temperature, the solvent having a boiling point temperature greater than the cross-linking temperature;
    spin coating the solution into the first opening;
    baking the solution at a second temperature between the cross-linking temperature and the boiling point temperature;
    curing the solution at a third temperature greater than the boiling point temperature to form a dielectric layer;
    patterning the dielectric layer to form a second opening; and
    forming a conductive via in the second opening.

11. The method of claim 10, wherein the solvent comprises propyl benzoate (C10H12O2), ethyl benzoate (C9H10O2), diethylene glycol (C4H10O3), N-Methyl-2-pyrrolidone (NMP) (C5H9NO), or combinations thereof.

12. The method of claim 10, wherein the boiling point temperature is above about 200° C.

13. The method of claim 10, wherein an amount of solvent in the solution is greater than about 5% by weight of the solution.

14. The method of claim 10, wherein the cross-linking temperature is above about 150° C.

15. The method of claim 10, wherein the baking the solution comprises heating the solution at the second temperature between about 60° C. and about 200° C. for a first duration from about 30 seconds to about 10 minutes, and wherein the curing the solution comprises heating the solution at the third temperature from about 300° C. to about 400° C. for a second duration from about 2 minutes to about 20 minutes.

16. A method for forming a dielectric structure, the method comprising:
    forming a first barrier layer over a substrate;
    forming a conductive layer over the first barrier layer;
    forming a first opening through the conductive layer and the first barrier layer;
    conformally depositing a second barrier layer over the conductive layer, the second barrier layer being over an uppermost surface of the conductive layer, the second barrier layer being in the first opening and interposed between laterally disposed portions of the first barrier layer;
    forming a dielectric material over the conductive layer, the dielectric material filling the first opening, the dielectric material comprising a precursor and a solvent, the solvent having a boiling point temperature greater than a cross-linking temperature of the precursor, the solvent comprising at least one of a benzoate, a glycol, or a pyrrolidone;
    cross-linking the dielectric material;
    after cross-linking the dielectric material, forming a second opening in the dielectric material, the second opening exposing a portion of the conductive layer; and
    filling the second opening with conductive material to form a conductive via.

17. The method of claim 16, wherein the solvent comprises propyl benzoate (C10H12O2), ethyl benzoate (C9H10O2), diethylene glycol (C4H10O3), N-Methyl-2-pyrrolidone (NMP) (C5H9NO), or combinations thereof.

18. The method of claim 16, wherein an amount of solvent in the dielectric material is greater than about 5% by weight of the dielectric material.

19. The method of claim 16, wherein the cross-linking the dielectric material comprises:
    heating the substrate at a first temperature between about 60° C. and about 200° C. for a first duration from about 30 seconds to about 10 minutes; and
    curing the substrate at a second temperature from about 300° C. to about 400° C. for a second duration from about 2 minutes to about 20 minutes.

20. The method of claim 16, wherein the dielectric material comprises a low-k dielectric material, a porous low-k material, a spin-on-glass material, or a spin-on-polymer material.

* * * * *